(12) United States Patent
Gutwin et al.

(10) Patent No.: US 6,671,218 B2
(45) Date of Patent: Dec. 30, 2003

(54) SYSTEM AND METHOD FOR HIDING REFRESH CYCLES IN A DYNAMIC TYPE CONTENT ADDRESSABLE MEMORY

(75) Inventors: Paul Gutwin, Williston, VT (US); Jonathan B. Ashbrook, Huntington, VT (US); Michael Bogaczyk, Milton, VT (US); Albert M. Chu, Essex, VT (US); Ezra Hall, Colchester, VT (US); Daryl Seitzer, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 10/013,963

(22) Filed: Dec. 11, 2001

(65) Prior Publication Data

US 2003/0112686 A1 Jun. 19, 2003

(51) Int. Cl.[7] .................................................. G11C 7/00
(52) U.S. Cl. ................... 365/222; 365/207; 365/189.07
(58) Field of Search ................................ 365/222, 207, 365/50, 189.07

(56) References Cited

U.S. PATENT DOCUMENTS

| | | | | |
|---|---|---|---|---|
| 4,928,260 A | * | 5/1990 | Chuang et al. ............... | 365/49 |
| 5,193,072 A | | 3/1993 | Frenkil et al. ............... | 365/222 |
| 5,511,033 A | | 4/1996 | Jung .......................... | 365/222 |
| 6,005,818 A | | 12/1999 | Ferrant ....................... | 365/222 |
| 6,310,880 B1 | * | 10/2001 | Waller ........................ | 370/400 |
| 6,339,539 B1 | * | 1/2002 | Gibson et al. ................ | 365/49 |
| 6,421,265 B1 | * | 7/2002 | Lien et al. ................... | 365/49 |
| 6,430,073 B1 | * | 8/2002 | Batson et al. ................ | 365/49 |
| 6,442,090 B1 | * | 8/2002 | Ahmed et al. ............... | 365/207 |
| 6,487,101 B1 | * | 11/2002 | Ashbrook et al. ............ | 365/49 |

* cited by examiner

Primary Examiner—Michael S. Lebentritt
Assistant Examiner—Tuan T. Nguyen
(74) Attorney, Agent, or Firm—H Daniel Schnurmann

(57) ABSTRACT

A system and method is disclosed for simultaneously searching and refreshing a memory array of a dynamic content addressable memory (DCAM). According to the disclosed invention, the information stored in a row of DCAM cells being refreshed is transferred from the memory array into sense amplifiers, during a read phase of a refresh operation. A search for a matching entry can then be performed, with respect to the information that is transferred to the sense amplifiers. To determine if there is a match, search information is simultaneously compared to the information that has been transferred to the sense amplifiers and to the information that is stored in other rows of DCAM cells of said memory array. Finally, the refresh of that row is completed by restoring the information from the sense amplifiers to that row of DCAM cells.

16 Claims, 2 Drawing Sheets

SYSTEM AND METHOD FOR HIDING REFRESH CYCLES IN A DYNAMIC TYPE CONTENT ADDRESSABLE MEMORY

FIELD OF THE INVENTION

This invention relates to integrated circuit memories and more specifically to a content addressable integrated circuit memory of the dynamic type in which stored contents expire unless periodically refreshed.

BACKGROUND

Up to the present time, content addressable memories have typically been implemented in static random access memories (SRAMs) rather than dynamic random access memories (DRAMs). SRAMs differ from DRAMs in that they retain stored data indefinitely, so long as power is supplied to the SRAM. By contrast, DRAMs, which have a dynamic type of memory cell (typically consisting of a single transistor and single capacitor), require the stored data therein to be periodically refreshed. Dynamic content addressable memories (DCAMs), like DRAMs, contain a dynamic type of memory cell (a "DCAM cell") which requires the stored data therein to be periodically refreshed.

Content addressable memories, including DCAMs, permit their stored contents to be searched for an entry that matches a search word presented thereto. To perform a search, a search word is input to each of a plurality of rows of DCAM cells in a DCAM array. If the search word matches an entry stored in any searched row of the DCAM array, a match signal is output for that row. The match signal is then converted to the address of the matching entry for output from the DCAM.

The requirement to periodically refresh the stored data of the DCAM poses a problem. The act of refreshing the data stored within a DCAM cell temporarily destroys the data within that DCAM cell. A refresh operation will read data from a row of DCAM cells into pairs of sense amplifiers. Pairs of sense amplifiers restore data signals received on a true bitline and a complement bitline of each DCAM cell to full voltage levels and then write these signals back to each DCAM cell in the row of DCAM cells to complete the refresh operation. During the time that the data is being read out and written back to a row of DCAM cells, the data is not stored in that row of DCAM cells. At such time, the data is temporarily unavailable to be searched at that row of DCAM cells.

One way to address this problem might be to block searches from being performed on memory arrays that are currently being refreshed, since otherwise the DCAM cannot assure that all entries stored in the memory array are fully searched. However, this is undesirable as it may involve significant delay to wait for all stored entries of the memory array to be refreshed.

SUMMARY

As a way of addressing such problem, the present invention provides a system and method for searching a DCAM which includes comparing search information to the information stored in a plurality of sense amplifiers. Such method includes reading information stored in a row of DCAM cells into sense amplifiers; and comparing search information to the information read into the sense amplifiers to determine if there is a match. Preferably, such method includes restoring the information from the sense amplifiers to the row of DCAM cells. A preferred way of doing the comparison is to apply the search information and the information read into the sense amplifiers to a plurality of match circuits coupled to a match line. The match line then indicates whether there is a match.

In addition, the present invention preferably provides a system and method by which search operations are performed simultaneously with the refreshing of a DCAM array while assuring that all stored entries of the array are searched. In such preferred embodiment, a system and method are provided for simultaneously searching and refreshing a memory array of a dynamic content addressable memory (DCAM). In such way, refresh cycles are hidden within, i.e. performed simultaneously with, search cycles of the DCAM. During a read phase of a refresh operation, the information stored in a row of DCAM cells being refreshed is transferred from the memory array into a row of sense amplifiers. The information transferred to and temporarily stored in the sense amplifiers is then available to be searched. To determine if the DCAM contains a matching entry, a search is performed simultaneously relative to the information temporarily stored in the row of sense amplifiers and to the information stored in other rows of DCAM cells of the memory array. Finally, in a write phase of the refresh operation, the information is rewritten from the sense amplifiers to the row of DCAM cells being refreshed.

DETAILED DESCRIPTION OF A PREFERRED EMBODIMENT

In the preferred embodiment to be described as follows, the principle of the invention is to normally provide search access at the DCAM cell to data stored within the DCAM cell. However, when the DCAM cell is being refreshed, search access to the data normally stored within the DCAM cell is provided at the sense amplifiers which are being used to refresh the DCAM cell. Special circuitry tracks the current availability of stored data, whether currently stored at the DCAM cell or, instead, currently being refreshed, in which case available to be searched at the sense amplifiers. In this way, search operations within a DCAM memory array are performed simultaneously with the refreshing of the DCAM memory array without any delay in outputting the results of such search.

Figure 1:
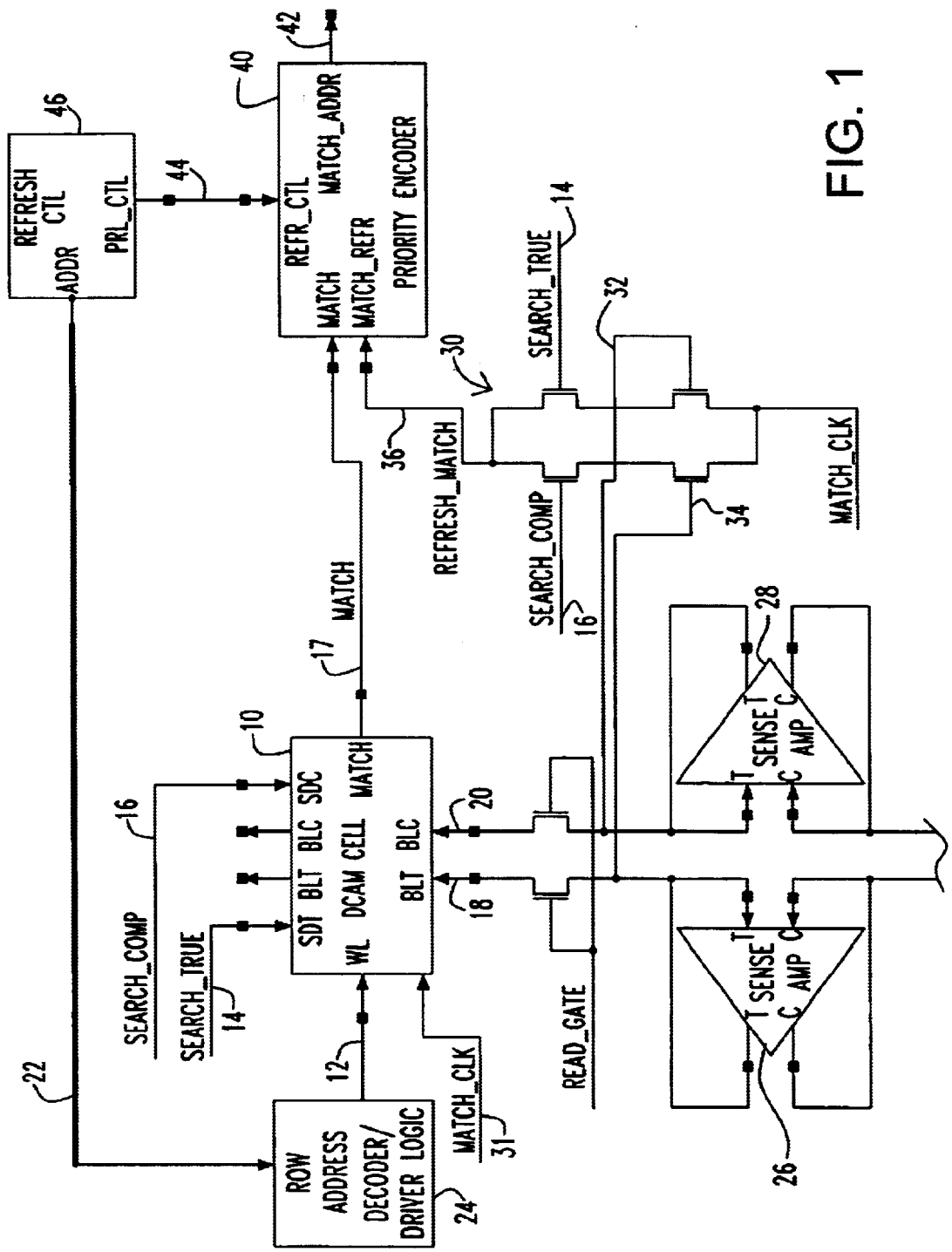
FIG. 1 is a block and schematic diagram illustrating a preferred embodiment of the invention.

FIG. 1 is a block and schematic diagram illustrating a preferred system embodiment of the invention. As shown in FIG. 1, a dynamic type content addressable memory (DCAM) includes a memory array including a plurality of DCAM cells 10. Each DCAM cell 10 receives the following signal inputs: wordline 12, and a pair of search data signals: SEARCH_TRUE 14, and SEARCH_COMP 16. Each DCAM cell 10 provides output on a matchline 17. A pair of a true bitline 18 and a complement bitline 20 provide input/output data access for storing into and retrieving data from the DCAM cell 10. The wordline 12 to a particular DCAM cell 10 is activated in response to an address 22 as decoded by row address decoder/driver logic 24. The wordline 12 is activated only during read, write or refresh operations to the DCAM cell 10, at which time the true bitline 18 and complement bitline 20 carry signals that read or write data to DCAM cell 10; or which read and write back again already stored data to the DCAM cell 10.

It will be understood that FIG. 1 illustrates an embodiment based on a ternary DCAM. Ternary CAM's have the following features. There are two storage elements per CAM cell. For normal operation the two storage elements store complementary data. However, the CAM cell can be masked with a "0", "0" stored bit combination. The ternary CAM cell operates as follows:

TABLE 1

|  | First Storage Element | Second Storage Element | Result |
|---|---|---|---|
| Stored Voltage | High | Low | Stored bit is a 1 |
|  | Low | High | Stored bit is a 0 |
|  | Low | Low | CAM cell is masked |
|  | High | High | Not allowed state |

By contrast, a binary CAM or a binary DCAM is implemented in such way that only complementary data states are stored within the CAM cell 10 as accessed through the true bitline 18 and complementary bitline 20 which are coupled only to one sense amplifier in place of sense amplifiers 26, 28. The single sense amplifier would then provide complementary outputs 32 and 34 to match circuit 30. These differences are not essential for the purposes of this description. The present invention can be implemented in a binary CAM as well as the ternary CAM implementations described here, with the foregoing modifications.

Typically, a content addressable memory array, such as one that includes a plurality of DCAM cells 10 as shown here, stores a plurality of data entries in respective rows of DCAM cells 10, each respective row being accessed by the same wordline. Each data entry of the memory array thus comprises a plurality of bits stored in a row DCAM cells 10 which are accessed by the same wordline 12. Once data entries have been stored into the DCAM memory array, a search operation can be performed to determine if a particular search word exists as a data entry already stored in the DCAM memory array. The search is performed by inputting pairs of search data signals 14 and 16 (a "search word") to each of a plurality of DCAM cells 10 in a row of DCAM cells 10 and observing the output on a matchline 17 which is coupled to the row of DCAM cells 10. If the particular search word is located as a matching entry within that row of DCAM cells 10 the matchline 17 coupled thereto indicates a matching entry. An encoder receives input from matchlines 17 coupled to respective rows of the memory array and outputs the address of any matching entry. These operations are germane to content addressable memories.

According to the present invention, search access to a row of DCAM cells 10 being refreshed is provided at sense amplifiers 26, 28. Thus, a match circuit 30, coupled to outputs 32 and 34 of sense amplifiers 28 and 26, respectively, allows the current data state of sense amplifiers 26, 28 to be searched. Input signals to match circuit 30: SEARCH_TRUE 14, and SEARCH_COMP 16 are the same search data signals which are input to a DCAM cell 10. MATCH_CLK 31 controls timing of search cycle operations performed by match circuit 30. MATCH_CLK 31 is maintained high when the refresh matchline 36 (and also matchlines 17) are precharged between searches. During a search, when MATCH_CLK 31 goes low, the data stored in sense amplifiers 26, 28 are matched to the search data signals 14, 16. If the respective signals match, the match circuit 30 conducts, and the refresh matchline 36 is pulled down. If the respective signals do not match, the match circuit 30 stays off, and no effect is produced upon the refresh matchline 36.

A plurality of match circuits 30 of this construction are placed within the DCAM, one match circuit 30 per pair of sense amplifiers 26, 28 in a row of sense amplifiers. The output of each match circuit 30 is coupled to a refresh matchline 36, one refresh matchline 36 being coupled to a row of match circuits 30, which in turn are coupled to respective pairs of a row of sense amplifiers 26, 28 for the memory array. In this way, the refresh matchline 36 indicates whether an entry (consisting of a plurality of data bits, which is temporarily stored in respective pairs 26, 28 of a row of sense amplifiers) matches a search word that is input to the row of match circuits 30.

Matchlines 17 (one for each row) and refresh matchlines 36 which correspond thereto (one for each row of match circuits 30) are input to an encoder 40. Normally, when the memory array is not being refreshed, the encoder 40 detects which of any matchlines 17 indicate a matching entry and outputs the address of that matching entry as MATCH_ADDR 42. When the memory array is being refreshed, the encoder 40 also detects whether a refresh matchline 36 for a row currently being refreshed indicates a matching entry. A signal 44 from a refresh control circuit 46 indicates to the encoder 40 the address of any row that is currently being refreshed. Thus, for any row currently being refreshed, the encoder 40 detects presence of a match on the refresh matchline 36 instead of the matchline 17 for that row, and in such case, encoder 40 outputs a matching address signal 42 using a row address received on signal 44.

Preferably, the encoder 40 is also a priority encoder. A priority encoder performs the above-described encoder functions and more. In cases when more than one candidate match is presented to (priority) encoder 40 from matchlines 17 and refresh matchline 36, such priority encoder selects a "best match" for output therefrom based on some predetermined criterion.

Refresh control circuit 46 cycles through addresses of the memory array, refreshing the memory array one row at a time. As each respective row is refreshed, the row address information on signal 44 is updated to encoder 40. In such way, encoder 40 keeps track of which matchlines 17 and refresh matchline 36 have valid signals.

Figure 2:
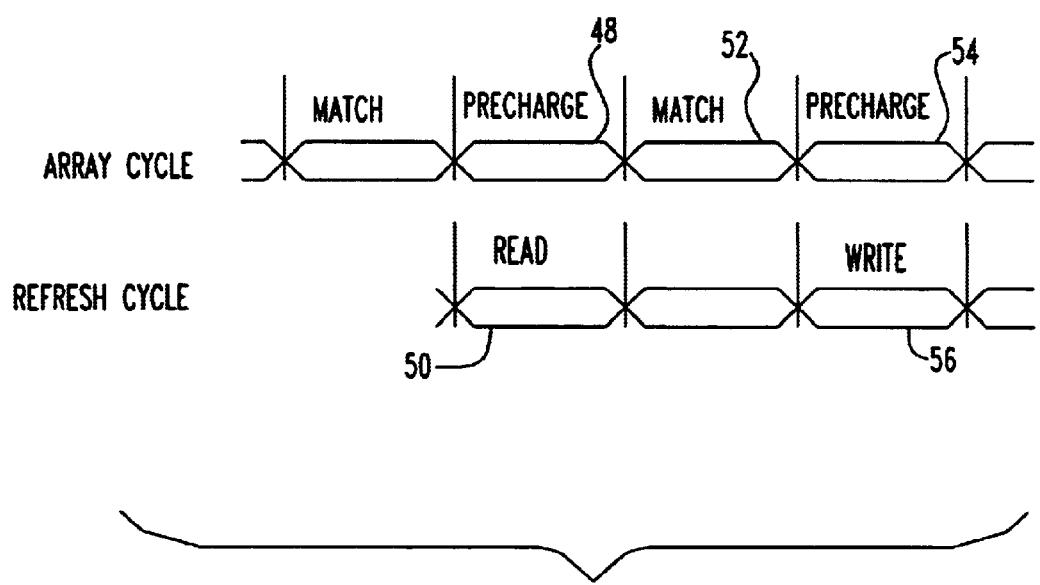
FIG. 2 is a timing diagram illustrating operation of a preferred embodiment of the invention.

The operation of the preferred embodiment will now be described, with reference to FIGS. 1 and 2. Content addressable memories including DCAMs typically have a two phase match operation, as shown in the timing diagram of FIG. 2. Prior to each search of the array, matchlines 17 are precharged to full voltage level. Each search occurs within a "Match" phase, as indicated in FIG. 2. During each search, an individual matchline 17 stays at the full voltage level if the search word matches the entry stored in a corresponding row of DCAM cells 10. Alternatively, an individual matchline 17 falls in voltage if the search word does not match the entry stored in the corresponding row of DCAM cells 10. After each Match phase, the matchlines 17 are precharged again for the next search, during which Precharge phase no searches are done. When refreshing, the refresh matchline 36 is cycled through Match and Precharge phases in the same manner.

Thus, between each Match phase of a search cycle, there is the "dead time" of a Precharge phase during which matchlines 17 and 36 are precharged for the next Match phase. This embodiment of the invention takes advantage of this "dead time" by performing, simultaneously with Precharge phases, read and write operations necessary to refresh the memory array. Thus, during a first Precharge phase 48, when matchlines 17 and 36 are being precharged, bit signals stored in a row of a DCAM cells 10 being refreshed are read out onto bitlines 18 and 20 and restored to full voltage levels at pairs of sense amplifiers 26, 28. This is the "Read" phase 50 of the refresh cycle shown in FIG. 2. The refresh cycle then pauses to permit searching of the memory array. Searching occurs during the next Match phase 52, at which time the refresh matchline 36, instead of the matchline 17 for the row currently being refreshed, indicates whether that row contains a matching entry. Then, during the next Precharge phase 54, the refresh cycle completes as a "Write" phase 56 for that row by writing the data back to row of DCAM cells 10 from pairs of sense amplifiers 26, 28.

While the invention has been described with respect to certain preferred embodiments thereof, those skilled in the art will understand the many modifications and enhancements which can be made without departing from the true scope and spirit of the invention as set forth in the claims appended below.

We claim:

1. A method of searching a dynamic content addressable memory (DCAM) comprising:

reading information stored in a row of dynamic content addressable memory (DCAM) cells into sense amplifiers; and comparing search information to said information read into said sense amplifiers to determine if there is a match.

2. The method of claim 1 further comprising restoring said information from said sense amplifiers to said row of DCAM cells.

3. The method of claim 1 wherein said comparing comprises applying said search information and said information read into said sense amplifiers to a plurality of match circuits coupled to a match line, said match line indicating whether there is a match.

4. A method of simultaneously searching and refreshing a memory array of a dynamic content addressable memory (DCAM) comprising:

transferring first information stored in first dynamic content addressable memory (DCAM) cells of said memory array into sense amplifiers;

determining if there is a match, simultaneously comparing search information to said first information as stored by said sense amplifiers and to second information as stored in second DCAM cells of said memory array; and restoring said first information from said sense amplifiers to said first DCAM cells to thereby refresh said first DCAM cells.

5. The method of claim 4 wherein said transferring deletes said first information from said first DCAM cells.

6. The method of claim 5 wherein said simultaneously comparing comprises applying said search information and said first information loaded into said sense amplifiers to a plurality of first match circuits coupled to a first match line, said first match line indicating whether there is a match.

7. The method of claim 6 wherein said simultaneously comparing further comprises applying said search information and said second information stored in said second DCAM cells to a plurality of second match circuits coupled to a second match line, said second match line indicating whether there is a match.

8. The method of claim 7 further comprising inputting said first match line and said second match line to an encoder, said encoder outputting an address when there is a match.

9. The method of claim 8 wherein said address indicates a location within said memory array where there is a match.

10. The method of claim 9 further comprising signaling said encoder at time of said transferring.

11. The method of claim 10 further comprising comparing second search information to said information after restoring said information to said first DCAM cells.

12. An integrated circuit of the type including a dynamic type content addressable memory (DCAM) including a memory array having first DCAM cells and second DCAM cells, sense amplifiers coupled to said first DCAM cells, a first matchline coupled to said first DCAM cells and a second matchline coupled to said second DCAM cells, said integrated circuit further comprising:

a third matchline coupled to match circuits, coupled to said sense amplifiers; and an encoder coupled to said first matchline, said second matchline and said third matchline, said encoder outputting an address of a matching entry, if any, stored within said first DCAM cells and said second DCAM cells at a time when said first DCAM cells store an entry, and said encoder outputting an address of a matching entry, if any, stored within said sense amplifiers and said second DCAM cells at a time when said sense amplifiers store an entry transferred from said first DCAM cells.

13. The system of claim 12 further comprising a plurality of search lines coupled to each of said first DCAM cells, said second DCAM cells and said match circuits, said search lines indicating an entry for which a match is searched within said memory array.

14. The system of claim 13 wherein said encoder is of the priority encoder type.

15. The system of claim 14 further comprising means for signaling said encoder that said entry is transferred from said first DCAM cells.

16. The system of claim 15 wherein said encoder is signaled in response to an address of said entry, said entry being transferred from said first DCAM cells to said sense amplifiers when refreshing said entry.

* * * * *